(12) United States Patent
Chang et al.

(10) Patent No.: US 11,948,792 B2
(45) Date of Patent: Apr. 2, 2024

(54) GLASS WAFERS FOR SEMICONDUCTOR DEVICE FABRICATION

(71) Applicant: CORNING INCORPORATED, Corning, NY (US)

(72) Inventors: Ya-Huei Chang, Zhudong Township (TW); Karl William Koch, III, Elmira, NY (US); Jen-Chieh Lin, Horseheads, NY (US); Jian-Zhi Jay Zhang, Ithaca, NY (US)

(73) Assignee: CORNING INCORPORATED, Corning, NY (US)

( * ) Notice: Subject to any disclaimer, the term of this patent is extended or adjusted under 35 U.S.C. 154(b) by 92 days.

(21) Appl. No.: 17/104,723

(22) Filed: Nov. 25, 2020

(65) Prior Publication Data
US 2021/0159076 A1 May 27, 2021

Related U.S. Application Data

(60) Provisional application No. 62/940,996, filed on Nov. 27, 2019.

(51) Int. Cl.
*H01L 21/02* (2006.01)
*H01L 29/16* (2006.01)

(52) U.S. Cl.
CPC .... *H01L 21/02422* (2013.01); *H01L 29/1604* (2013.01)

(58) Field of Classification Search
CPC ........... H01L 21/02422; H01L 29/1604; H01L 21/02002; H01L 21/02576; H01L 21/02532; H01L 21/02488; H01L 21/31695; H01L 29/41708; H01L 29/0817; H01L 29/73; H01L 24/13; H01L 24/16; H01L 24/81; H01L 2224/02166; H01L 2224/0401; H01L 2224/05644;
(Continued)

(56) References Cited

U.S. PATENT DOCUMENTS 3,338,696 A  8/1967  Dockerty
3,682,609 A  8/1972  Dockerty
(Continued)

FOREIGN PATENT DOCUMENTS

JP   2005-032858 A   2/2005

OTHER PUBLICATIONS

International Search Report and Written Opinion of the International Searching Authority; PCT/US2020/061990 dated Mar. 23, 2021, 9 pages; Korean Patent Office.

*Primary Examiner* — Mohammad A Rahman
(74) *Attorney, Agent, or Firm* — Yiqun Zhao

(57) ABSTRACT

Embodiments of a glass wafer for semiconductor fabrication processes are described herein. In some embodiments, a glass wafer includes: a glass substrate comprising: a top surface, a bottom surface opposing the top surface, and an edge surface between the top surface and the bottom surface; a first coating disposed atop the glass substrate, wherein the first coating is a doped crystalline silicon coating having a sheet-resistance of 100 to 1,000,000 ohm per square; and a second coating having one or more layers disposed atop the glass substrate, wherein the second coating comprises a silicon containing coating, wherein the glass wafer has an average transmittance (T) of less than 50% over an entire wavelength range of 400 nm to 1000 nm.

15 Claims, 13 Drawing Sheets

(58) Field of Classification Search
CPC . H01L 2224/13021; H01L 2224/13082; H01L 2224/13101; H01L 2224/13147; H01L 2224/16225; H01L 2224/81815; H01L 2924/10329; H01L 2924/351; H01L 2924/3512; H01L 29/7371; H01L 29/0696; H01L 23/49568; H01L 27/082; H01L 29/737; C25D 5/02; C03C 17/002; C03C 17/02; C03C 17/3605; C03C 17/3607; C03C 17/361; C03C 17/3613; C03C 17/3615; C03C 17/3618; H10K 85/6574; H10K 85/631; H10K 85/622; H10K 85/6572; H10K 2101/10; H10K 2101/40; H10K 50/18; H10K 50/11

See application file for complete search history.

(56) References Cited

U.S. PATENT DOCUMENTS

| | | | |
|---|---|---|---|
| 6,229,611 B1 | 5/2001 | Hung | |
| 8,405,169 B2 | 3/2013 | Cheng et al. | |
| 2002/0014626 A1* | 2/2002 | Nakajima | H01L 27/1248 257/E27.111 |
| 2007/0034876 A1* | 2/2007 | Yamazaki | H01L 29/04 257/E27.113 |
| 2007/0159631 A1 | 7/2007 | Huang et al. | |
| 2010/0024862 A1* | 2/2010 | Tawada | C23C 16/407 438/609 |
| 2011/0309467 A1* | 12/2011 | Matsumoto | H01L 27/1266 257/506 |
| 2012/0172209 A1 | 7/2012 | Lu et al. | |
| 2012/0261787 A1 | 10/2012 | Stamper | |
| 2012/0276689 A1 | 11/2012 | Canale et al. | |
| 2013/0105806 A1 | 5/2013 | Liu et al. | |
| 2016/0049540 A1* | 2/2016 | Kapur | H01L 31/02167 136/256 |
| 2018/0033742 A1* | 2/2018 | Chua | H01L 23/576 |
| 2018/0275318 A1 | 9/2018 | Amin et al. | |
| 2019/0056653 A1* | 2/2019 | Kawahara | G03F 1/48 |
| 2019/0064651 A1* | 2/2019 | Shishido | C23C 14/06 |

* cited by examiner

GLASS WAFERS FOR SEMICONDUCTOR DEVICE FABRICATION

This application claims the benefit of priority under 35 U.S.C. § 120 of U.S. Provisional Application Ser. No. 62/940,996 filed on Nov. 27, 2019 the content of which is relied upon and incorporated herein by reference in its entirety.

FIELD

Embodiments of the present disclosure generally relate to semiconductor fabrication processing and more specifically to glass wafers for semiconductor device fabrication.

BACKGROUND

Various forms of silicon wafers have been in use to make integrated circuits for decades. Accordingly, modern semiconductor fabrication equipment is set up to detect and process silicon wafers.

For example, the fabrication tools used in the process of making integrated circuits and other devices include, among other items, automatic loading and unloading equipment (e.g., cassette autoloaders that load and unload into lithographic equipment, etching equipment, and the like). These cassette autoloaders depend on various sensors to determine the placement, position, and confirmation of location as the wafers move in and out of the tools. This is accomplished by the use of a wafer flat, notch, or other like mechanism positioned at the edge of the wafer, which must be oriented correctly within the tool.

Silicon is the dominant semiconductor material in use today. In order for glass to be used in a fabrication equipment designed and dedicated to detecting and processing silicon wafers, equipment adjustments would need to be made to semiconductor fabrication equipment to suit glass. For example, one problem is that many of the sensors were designed to sense silicon wafers. Existing sensors are mechanical, optical, and/or inductive/capacitive in nature. While the mechanical-type sensors may work with other materials, the electrical or optical sensors do not always work with other materials. While it is possible to change every sensor on the tools to enable sensing of wafers made of other (i.e., non-silicon) materials, this is undesirable in a manufacturing environment. Another issue is that electrostatic chucks, which are commonly used in semiconductor fabrication equipment, use electrostatic fields to hold the wafer in place, but the electrostatic chucks as configured for silicon wafer would not work with wafer materials that are not susceptible to electrostatic fields like dielectrics such as glass materials.

Accordingly, the inventors have developed improved glass substrates for semiconductor device fabrication processes.

SUMMARY

Embodiments of a glass wafer for a semiconductor device are described herein. In some embodiments, a glass wafer for a semiconductor device includes: a glass substrate comprising: a top surface (102), a bottom surface (104) opposing the top surface, and an edge surface (106) between the top surface and the bottom surface; a first coating (108) disposed atop the glass substrate, wherein the first coating is a doped crystalline silicon coating having a sheet-resistance of 100 to 1,000,000 ohm per square; and a second coating (110) having one or more layers disposed atop the glass substrate, wherein the second coating comprises a silicon containing coating, wherein the glass wafer has an average transmittance (T) of less than 50% over an entire wavelength range of 400 nm to 1000 nm.

In some embodiments, a glass wafer for a semiconductor device includes: a glass substrate comprising: a top surface (102), a bottom surface (104) opposing the top surface, and an edge surface (106) between the top surface and the bottom surface; a coating (110) having one or more layers disposed atop the glass wafer, wherein the coating comprises a silicon containing coating, and wherein the glass wafer has an average transmittance (T) of less than 50% over an entire wavelength range of 400 nm to 1000 nm.

In some embodiments, a method of fabricating an electronic device includes loading a glass wafer onto a substrate support within a substrate aligner chamber, wherein the substrate aligner comprises a light source, and an optical sensor configured to detect a light beam from the light source, wherein the glass wafer comprises: a glass substrate comprising: a top surface, a bottom surface opposing the top surface, and an edge surface between the top surface and the bottom surface, a first coating disposed atop the glass substrate, wherein the first coating is a doped crystalline silicon coating having a sheet-resistance of 100 to 1,000,000 ohm per square, and a second coating having one or more layers disposed atop the glass substrate, wherein the second coating comprises a silicon containing coating, wherein the glass wafer has an average transmittance (T) of less than 50% over an entire wavelength range of 400 nm to 1000 nm; rotating the substrate support to position the glass wafer in a predetermined position in the substrate aligner chamber, wherein the predetermined position is reached when the optical sensor detects the light beam from the light source; and transferring the glass wafer to a semiconductor processing chamber for further processing.

In some embodiments, a glass wafer for a semiconductor device includes: a glass substrate comprising: a top surface (102), a bottom surface (104) opposing the top surface, and an edge surface (106) between the top surface and the bottom surface; and a silicon containing coating disposed on the glass substrate, wherein the silicon containing coating comprises at least two silicon containing layers, and wherein a difference in the refractive index values of adjacent layers is greater than 0.5.

Other and further embodiments of the present disclosure are described below.

FIGURES

Embodiments of the present disclosure, briefly summarized above and discussed in greater detail below, can be understood by reference to the illustrative embodiments of the disclosure depicted in the appended drawings. It is to be noted, however, that the appended drawings illustrate only typical embodiments of this disclosure and are therefore not to be considered limiting of its scope.

Figure 1A:
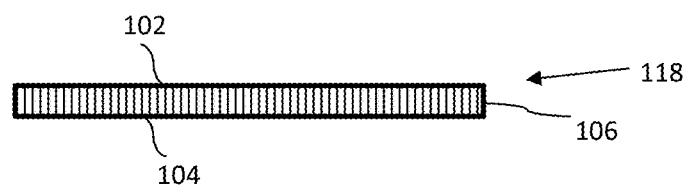
FIG. 1A-1B depicts an exemplary glass substrate in accordance with some embodiments of the present disclosure.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DESCRIPTION

In the following detailed description, for purposes of explanation and not limitation, example embodiments disclosing specific details are set forth to provide a thorough understanding of various principles of the present disclosure. However, it will be apparent to one having ordinary skill in the art that the present disclosure may be practiced in other embodiments that depart from the specific details disclosed herein. Moreover, descriptions of well-known devices, methods and materials may be omitted so as not to obscure the description of various principles of the present disclosure. Finally, wherever applicable, like reference numerals refer to like elements.

Unless otherwise expressly stated, it is in no way intended that any method set forth herein be construed as requiring that its steps be performed in a specific order. Accordingly, where a method claim does not actually recite an order to be followed by its steps, or it is not otherwise specifically stated in the claims or descriptions that the steps are to be limited to a specific order, it is no way intended that an order be inferred, in any respect. This holds for any possible non-express basis for interpretation, including: matters of logic with respect to arrangement of steps or operational flow; plain meaning derived from grammatical organization or punctuation; the number or type of embodiments described in the specification.

As used herein, the term "and/or," when used in a list of two or more items, means that any one of the listed items can be employed by itself, or any combination of two or more of the listed items can be employed. For example, if a composition is described as containing components A, B, and/or C, the composition can contain A alone; B alone; C alone; A and B in combination; A and C in combination; B and C in combination; or A, B, and C in combination.

Semiconductor devices are made by a sequence of fabrication steps, such as thin film deposition, oxidation or nitration, etching, polishing, and thermal and lithographic processing. Although multiple fabrication steps may be performed in a single processing apparatus, wafers must be transported between different processing tools for at least some of the fabrication steps.

Semiconductor fabrication steps are carried out using automated machinery. Wafers are stored in carriers for transfer between processing tools and other locations. Prior to transport to the processing tool, the carrier wafer must be properly aligned to allow the processing tool to complete the necessary fabrication step.

A common orientation method involves using optical sensors having a light source, which is typically a visible light source, and a detector for generating and detecting a light beam. A silicon wafer having a notch along its edge is positioned on a rotating support surface. The surface of the silicon wafer is opaque and will block the passage of the light beam between the source and detector. However, when the silicon wafer is rotated such that the notch is in the location of the light beam, the detector senses the light beam and stops the rotation of the support surface. The stopped support surface, holding the silicon wafer is then in the proper position for transfer to, for example, a lithography device for processing of the wafer to form a circuit.

Since glass wafers are transparent, a light beam from the light source will pass through the glass wafer as well as the notch. That is, the sensor cannot distinguish between the glass wafer and the notch. Consequently, the glass wafer will not stop rotating, and transfer to the fabrication tool will not occur.

The present disclosure describes glass wafers for semiconductor device fabrication that overcome the problems associated with sensors not functioning with glass wafers. As used herein, the term "wafer" refers to a support surface suitable for having an electronic device formed thereon. Furthermore, glass has certain unique characteristics that make it ideal for the certain applications. For example, for radio frequency (RF) components, glass offers low RF loss and low nonlinearity in comparison to silicon in general. Products such as RF-switches and antenna tuners can benefit from glass in next generation networks and mobile phones. Embodiments of the glass wafer described herein have various coatings formed thereon. For convenience, the term "coating" is intended to include films, coatings, or layers disposed on a surface.

The coatings disposed on the glass wafer are formed by any known method in the art, including discrete deposition or continuous deposition processes. In some embodiments, the coatings are deposited via plasma enhanced chemical vapor deposition (PECVD) as commonly used in the art. In some embodiments, the coatings are deposited via physical vapor deposition (PVD) as commonly used in the art. As used herein (e.g., in relation to a glass wafer 100), the term "dispose" includes coating, depositing and/or forming a material onto a surface using any known method in the art. The disposed material may constitute a coating as defined herein. The phrase "disposed on" includes the instance of forming a material onto a surface such that the material is in direct contact with the surface and also includes the instance where the material is formed on a surface, where one or more intervening material(s) is between the disposed material and the surface. The intervening material(s) may constitute a coating, as defined herein.

Embodiments of the glass wafer described herein comprises a glass substrate 118 comprising a top surface 102, a bottom surface 104 opposing the top surface 102, and an edge surface 106 between the top surface 102 and the bottom surface 104, a first coating, and a second coating. FIG. 1A depicts a glass substrate 118 comprising: a top surface 102, a bottom surface 104 opposing the top surface 102, and an edge surface 106 between the top surface 102 and the bottom surface 104. The top surface 102 is the surface of the glass substrate 118 having various coatings, as described herein, disposed thereon. In some embodiments, the glass substrate 118 may be any size suitable for use with existing semiconductor manufacturing equipment. For example, in some embodiments, the glass substrate 118 may have a diameter of 300 mm. In some embodiments, the glass substrate 118 may have a diameter of 200 mm. In some embodiments, the glass substrate 118 has a diameter of 300 mm and a thickness of 0.3 mm to 1 mm, preferably 0.5 mm to 0.8 mm, more preferably 0.75 mm to 0.8 mm. In some embodiments, the glass substrate 118 has a diameter of 300 mm and a thickness of 0.775 mm. In some embodiments, the glass substrate 118 has a diameter of 200 mm and a thickness of 0.725 mm.

Figure 9A:
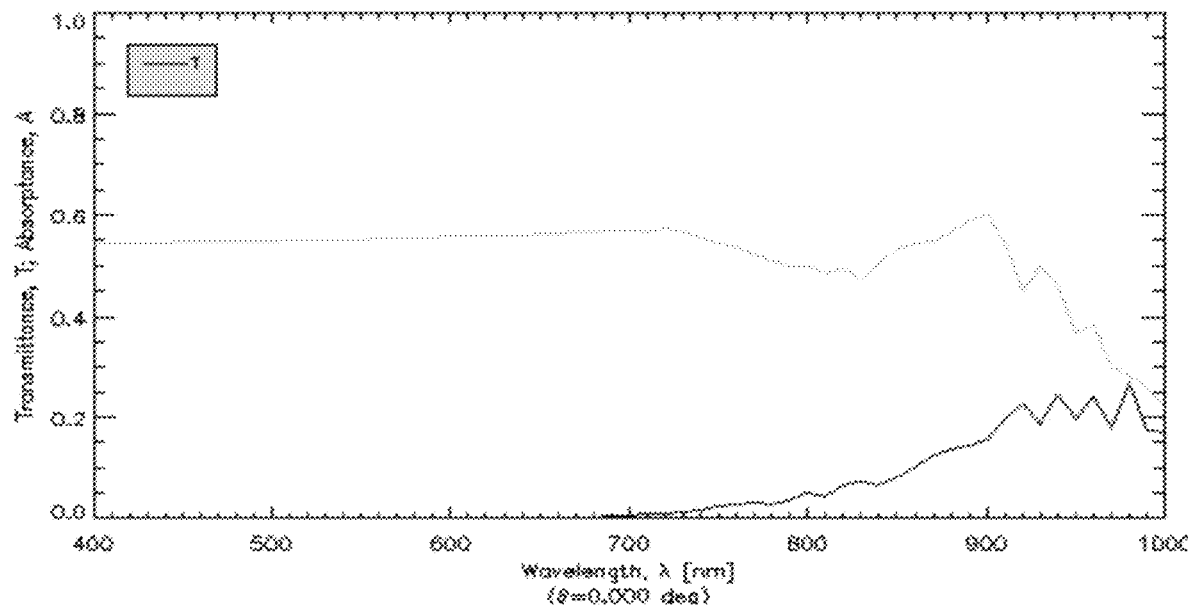
FIG. 9A depicts the transmission of a 300 nm thick a-Ge layer on a fused silica substrate.
Figure 9B:
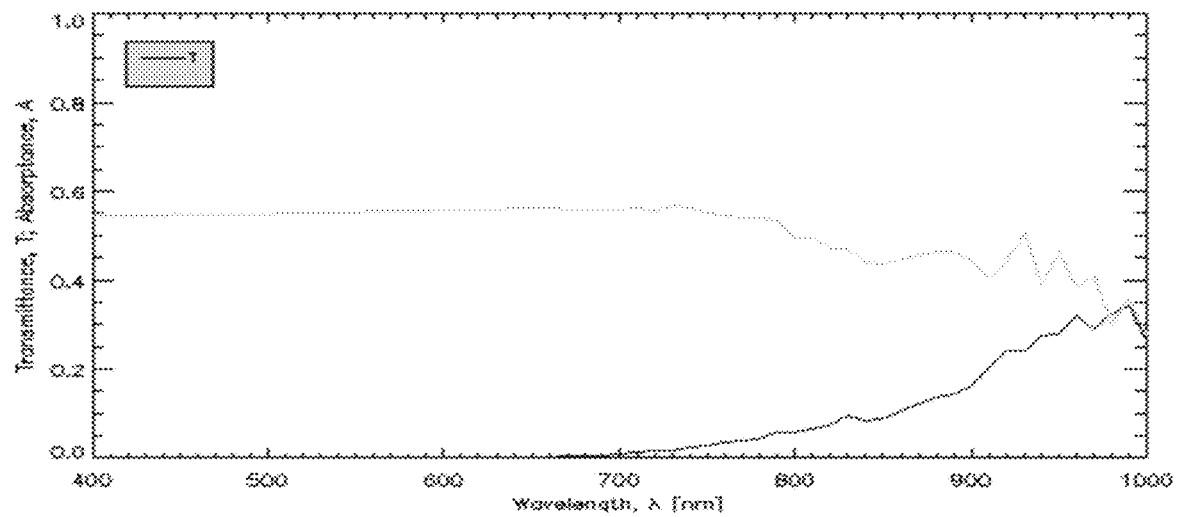
FIG. 9B depicts the transmission of a combined 300 nm thick a-Ge layer with a 50 nm doped nanocrystalline-Si layer on a fused silica substrate.

In some embodiments, the glass substrate 118 can be a high purity fused silica (HPFS) glass, or an alkali-free silicate glass, or a borosilicate glass, or an alkali aluminosilicate glass, or an alkali aluminoborosilicate glass, or an alkaline-earth boro-aluminosilicate glasses, or the like. High purity fused silica (such as Corning Incorporated's HPFS® type high purity fused silica 7980 glass) has extremely high purity due to its manufacturing process, and is 100% compatible with front end of line (FEOL) environments. Front end of line (FEOL) refers to the first portion of integrated circuit fabrication where individual devices (e.g. transistors, capacitors, resistors, etc.) are patterned in the semiconductor. Accordingly, front end of line (FEOL) processes are sensitive to the introduction of contaminants (i.e. materials not normally present in integrated circuit fabrication). Furthermore, in many FEOL processes non-Si based metals are not permitted. Accordingly, the coatings discussed below are silicon-bearing materials such as amorphous silicon, polysilicon, silicon nitride, silicon dioxide, or silicon oxynitride. In some embodiments, the coatings discussed below may be an amorphous germanium (a-Ge). While interference-based coatings can deliver broadband low transmittance as discussed below, some optical sensors may require extremely low transmission that only reflective or absorptive filters can deliver. While many metals are good reflective materials, they are not FEOL-friendly, and thus not accepted in typical semiconductor fabrication. Germanium, on the other hand, is broadly accepted as a suitable material in the semiconductor fabrication process. Amorphous germanium is an exemplary material with absorption and transmission characteristics that can be used to deliver a coating with low transmittance in the visible spectral window while delivering less than 40% in the near infrared (NIR) window all the way to 1000 nm. FIG. 9A shows the transmission of a 300 nm thick a-Ge layer on a 775 μm fused silica substrate. FIG. 9B shows the transmission of a combined 300 nm thick a-Ge layer with a 50 nm doped nanocrystalline-Si layer on a 775 μm fused silica substrate. The latter combination would deliver both the optical and the electrical performance required by a typical semiconductor fab configured for handling Si wafers. The 300 nm thickness a-Ge layer provides transmittance of less than 0.01% at 650 nm, which is a typical sensor wavelength used with LED light sources.

In some embodiments, the glass substrate 118 is a fusion formed glass. The fusion draw process may result in a pristine, fire-polished glass surface that reduces surface-mediated distortion to high resolution TFT backplanes and color filters. The downdraw sheet drawing processes and, in particular, the fusion process described in U.S. Pat. Nos. 3,338,696 and 3,682,609 (both to Dockerty), which are incorporated by reference, can be used herein. Without being bound by any particular theory of operation, it is believed that the fusion process can produce glass substrates that do not require polishing. The glass substrates produced by the fusion process have an average surface roughness as measured by atomic force microscopy of less than 0.2 nm (Ra). Such low roughness facilitates critical applications where bonding to another flat surface is needed.

Figure 2:
FIG. 2 depicts an exemplary glass substrate having a passivation coating in accordance with some embodiments of the present disclosure.

In some embodiments, as depicted in FIG. 2, the glass substrate 118 may have a passivation coating 112. For glass substrates 118 that are not pure $SiO_2$ (i.e. 100 wt % $SiO_2$), the passivation coating 112 prevents non-silicon glass constituents from migrating out and contaminating the semiconductor fabrication equipment. In some embodiments, the passivation coating 112 is disposed on the top surface 102, the bottom surface 104, and the edge surface 106 of the glass substrate 118. In some embodiments, the passivation coating 112 is one of SiN, $SiO_2$, or SiON. The thickness of the passivation coating 112 may be adjusted based on density and porosity of the passivation coating and based on the temperature and temperature exposure time of the coating within a semiconductor fabrication process. In some embodiments, the passivation coating 112 has a thickness of 100 angstroms to 10,000 angstroms, preferably 500 angstroms to 1,000 angstroms.

Figure 3A:
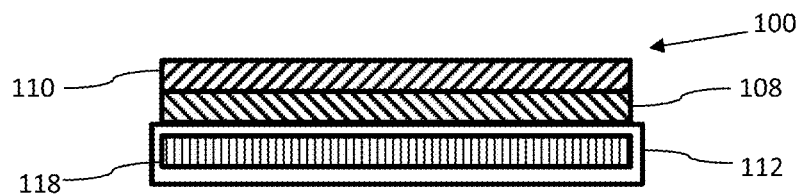
FIG. 3A-3B depict exemplary glass wafers in accordance with some embodiments of the present disclosure.
Figure 3B:
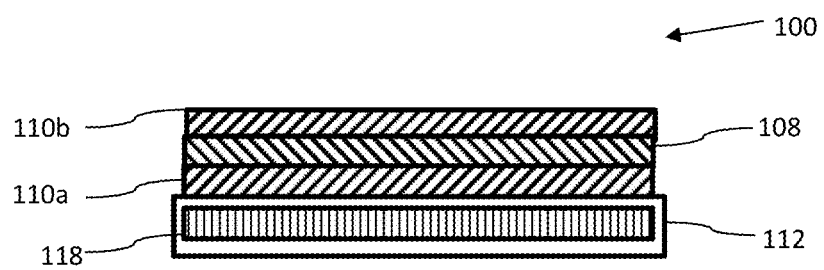

FIGS. 3A and 3B depict a glass wafer 100 having a glass substrate 118 with an (optional) passivation layer 112 and a first coating 108 and a second coating 110.

The first coating 108 is a doped crystalline silicon coating with silicon crystal size in the nanometer to micrometer range (nano-crystalline to micro-crystalline range). Exemplary dopants that may be used include phosphorus, boron, or arsenic. Typical electrostatic chucks in semiconductor fabrication equipment are designed to chuck silicon wafers and accordingly would not be able to chuck glass wafers, without significantly higher operating voltage. Accordingly, the first coating 108, disposed on one side of the glass substrate 118 provides sufficient conductivity for a typical electrostatic chuck (i.e. at an operating voltage suitable for chucking a silicon wafer) to chuck the glass substrate to the electrostatic chuck. To enable the glass wafer 100 to chuck to an electrostatic chuck, the doped crystalline silicon coating has a sheet-resistance of 100 ohm per square to 1,000,000 ohm per square, preferably 100 ohm per square to 250,000 ohm per square, and more preferably 100 ohm per square to 50,000 ohm per square. The term "sheet resistance" as used herein denotes the isotropic resistivity of a layer relative to the thickness thereof. Sheet resistance can be measured using the four-point probe method. The four-point probe method is a commonly used testing method to measure the resistivity of any semiconductor material. The 4-point probe setup consists of four equally spaced tungsten metal tips with finite radius. Each tip is supported by springs on the other end to minimize sample damage during probing. The four metal tips are part of an auto-mechanical stage which travels up and down during measurements. A high impedance current source is used to supply current through the outer two probes; a voltmeter measures the voltage across the inner two probes to determine the sample resistivity. Typical probe spacing is about 1 mm.

In some embodiments, the doped crystalline silicon coating 108 has a thickness of at least 100 angstroms, and preferably at least 500 angstroms. In some embodiments, the doped crystalline silicon coating 108 is phosphorus-doped nano-crystalline silicon having a thickness of 500 angstroms and a sheet-resistance of 2000 ohms per square.

In some embodiments, the second coating 110 is a silicon-containing coating composed of one or more layers. In some embodiments, the second coating 110 comprises a layer of undoped amorphous silicon. In some embodiments, the second coating 110 comprises a layer of undoped amorphous germanium. In some embodiments, the second coating 110 comprises a layer of silicon nitride, a layer of undoped amorphous silicon, and a layer of silicon dioxide, where the layer of silicon nitride is disposed atop the layer of undoped amorphous silicon, the layer of undoped amorphous silicon is disposed atop the layer of silicon dioxide, and the layer of silicon dioxide is atop the doped crystalline silicon coating. The above coatings and ordering thereof are exemplary and may be modified by one of ordinary skill in the art to achieve a glass substrate having a transmittance (T) range described below.

In some embodiments, the total thickness of the second coating 110 and the first coating 108 is less than 5 micron. In some embodiments, the total thickness of the second coating 110 and the first coating 108 is less than 4 micron. In some embodiments, the total thickness of the second coating 110 and the first coating 108 is less than 3 micron. In some embodiments, the total thickness of the second coating 110 and the first coating 108 is less than 2 micron. In some embodiments, the total thickness of the second coating 110 and the first coating 108 is less than 1 micron. In some embodiments, the total thickness of the second coating 110 and the first coating 108 is greater than 0.1 micron to less than 5 micron. In some embodiments, the total thickness of the second coating 110 and the first coating 108 is greater than 0.1 micron to less than 1 micron.

In some embodiments, the doped crystalline silicon coating 108 is disposed on the top surface 102 of the glass substrate 118. In some embodiments, the doped crystalline silicon is disposed on the entire top surface 102 of the glass substrate 118 as show in FIGS. 3A-3B. In some embodiments, the doped crystalline silicon coating 108 is disposed directly on the top surface 102 of the glass substrate 118 (i.e. no intervening coating between the glass substrate 118 and the doped crystalline silicon coating 108). In some embodiments, as shown in FIG. 3A, the doped crystalline silicon coating 108 is disposed directly on the passivation coating 112. In some embodiments, as depicted in FIG. 3B, the doped crystalline silicon coating 108 may be part of a multi-layer stack formed with the second coating (as described below), where the second coating comprises at least two layers and the first coating 108 is located between the at least two layers of the second coating 110a, 11b.

In some embodiments, as shown in FIG. 3A, the second coating 110 is disposed directly on the doped crystalline silicon coating 108. In some embodiments, the second coating 110 is disposed directly on the glass substrate 100 (i.e. no passivation layer and no first coating). In some embodiments, the second coating 110 is disposed directly on a passivation layer 112 (i.e. no first coating). In some embodiments, the second coating 110 covers the entire top surface of the directly underlying layer (e.g. the entire surface of the glass substrate 118). In some embodiments, the second coating 110 covers a portion of the directly underlying surface from the edge to a radial distance 2 mm toward a center of the directly underlying surface.

Table 1 below depicts an example of a glass wafer in accordance with some embodiments of the current disclosure, where the glass substrate 118 is a high purity fused silica glass having a layer of phosphorus-doped nano-crystalline silicon disposed atop the high purity fused silica glass substrate, a layer of silicon dioxide ($SiO_2$) disposed atop the phosphorus-doped nano-crystalline silicon, a layer of amorphous silicon disposed atop the silicon dioxide layer, a layer of silicon nitride disposed atop the amorphous silicon layer. Table 1 further shows the refractive index of each layer of the silicon containing coating disposed atop the glass substrate. The coating show in Table 1 has four silicon containing layers, where the difference in refractive index values between adjacent layers is greater than 0.5. In some embodiments, the difference in refractive index values between adjacent layers is greater than 1. In some embodiments, the difference in refractive index values between adjacent layers is greater than 2. In the embodiment depicted in Table 1 the outermost layer (i.e. the layer the furthest away from the substrate) is silicon nitride. In some embodiments, the outermost layer may be silicon dioxide or silicon oxynitride. In some embodiments, an outermost layer of silicon nitride or silicon oxynitride provides mechanical abrasion resistance for the glass wafer.

TABLE 1

| Layer | Material | Refractive Index at 510 nm | Physical Thickness (nm) |
|---|---|---|---|
| 1 | Silicon nitride | 1.84 | 75 |
| 2 | Amorphous silicon | 4.52 | 52 |
| 3 | Silicon dioxide ($SiO_2$) | 1.48 | 116 |
| 4 | Phosphorus-doped nano-crystalline silicon | 4.11 | 45 |
| Substrate | HPFS | 1.46 | |

Figure 7A:
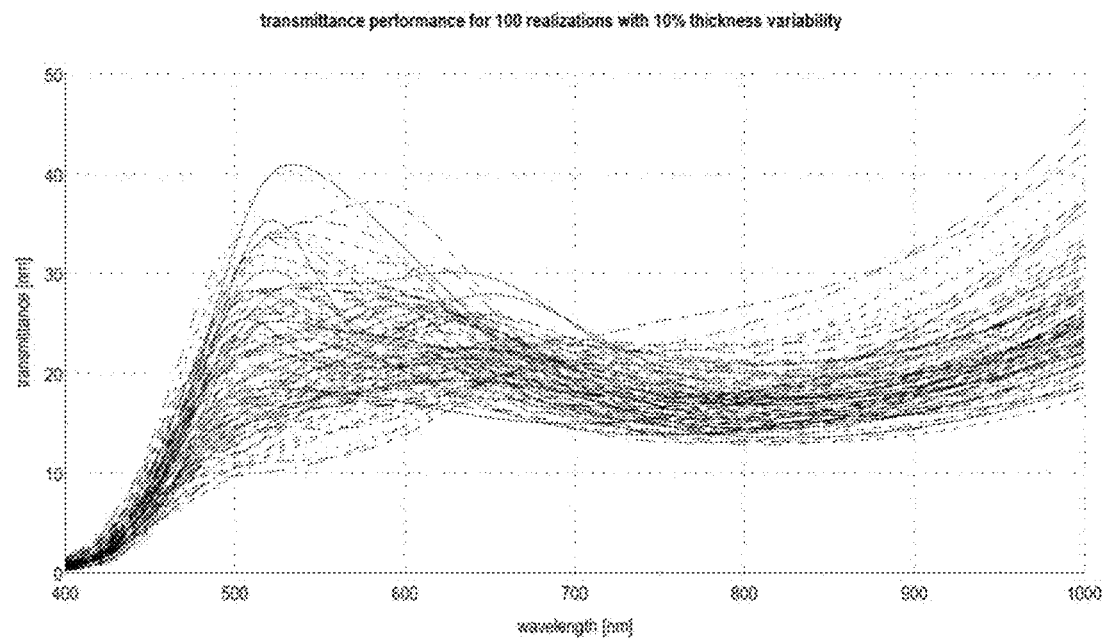
FIG. 7A depicts a transmittance versus wavelength graph of the exemplary coating in Table 1 having a 10% thickness variability for each layer.

FIG. 7A depicts a transmittance versus wavelength graph in which the thickness of each layer of the coating in Table 1 is randomly adjusted (e.g. increased or decreased) by a random number corresponding to a Gaussian distribution whose mean value is the layer design thickness and whose variance is 10% of the layer design thickness. The transmittance of the randomly adjusted coating is calculated over a wavelength range of 400 nm to 1000 nm. This process is performed 100 times and generates the curves shown in FIG. 7A. As shown in FIG. 7A, the transmittance for the coating in Table 1 is less than 40% over a wavelength range of 400 nm to 1000 nm for a 10% random thickness variability.

Figure 7B:
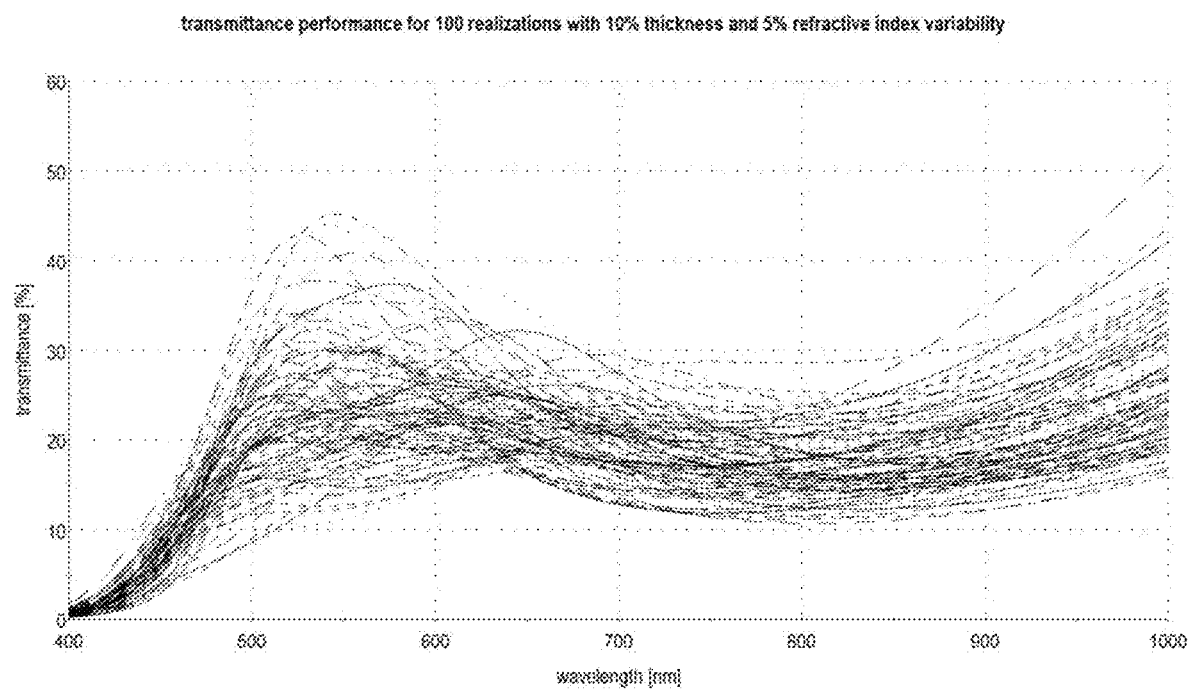
FIG. 7B depicts a transmittance versus wavelength graph of the exemplary coating in Table 1 having a 10% thickness variability and a 5% refractive index variability for each layer.

FIG. 7B depicts a transmittance versus wavelength graph in which the thickness of each layer of the coating in Table 1 is randomly adjusted (e.g. increased or decreased) by a random number corresponding to a Gaussian distribution whose mean value is the layer design thickness and whose variance is 10% of the layer design thickness and where the refractive index of each layer is randomly adjusted (e.g. increased or decreased) by a random number corresponding to a Gaussian distribution whose mean value is the layer refractive index and whose variance is 5% of the layer refractive index. The transmittance of the randomly adjusted coating is calculated over a wavelength range of 400 nm to 1000 nm. This process is performed 100 times and generates the curves shown in FIG. 7B. As shown in FIG. 7B, the transmittance for the coating in Table 1 is less than 50% over a wavelength range of 400 nm to 1000 nm for a 10% random thickness variability and a 5% random refractive index variability.

Table 2 below depicts an example of a glass wafer in accordance with some embodiments of the current disclosure, where the glass substrate 118 is a high purity fused silica glass having a layer of nano-crystalline silicon disposed atop the high purity fused silica glass substrate, a layer of silicon dioxide ($SiO_2$) disposed atop the nano-crystalline silicon, a layer of amorphous silicon disposed atop the silicon dioxide layer, and a layer of silicon dioxide disposed atop the amorphous silicon layer. Table 1 further shows the refractive index of each layer of the silicon containing coating disposed atop the glass substrate.

TABLE 2

| Layer | Material | Refractive Index at 950 nm | Physical Thickness |
|---|---|---|---|
| 1 | Silicon dioxide | 1.45 | 50 nm |
| 2 | Amorphous silicon | 3.60 | 38 nm |
| 3 | Silicon dioxide ($SiO_2$) | 1.45 | 99 nm |
| 4 | nano-crystalline silicon | 4.11 | 75 nm |
| Substrate | HPFS | 1.46 | 0.7 mm |

Figure 8A:
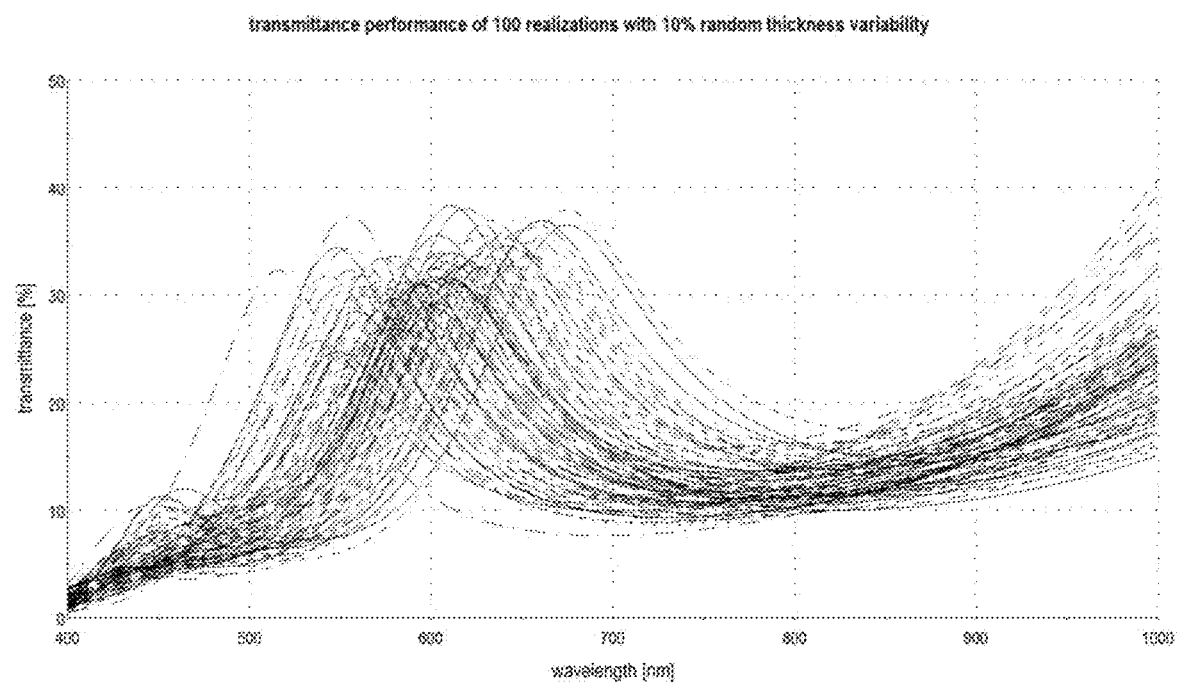
FIG. 8A depicts a transmittance versus wavelength graph of the exemplary coating in Table 2 having a 10% thickness variability for each layer.

FIG. 8A depicts a transmittance versus wavelength graph in which the thickness of each layer of the coating in Table 2 is randomly adjusted (e.g. increased or decreased) by a random number corresponding to a Gaussian distribution whose mean value is the layer design thickness and whose variance is 10% of the layer design thickness. The transmittance of the randomly adjusted coating is calculated over a wavelength range of 400 nm to 1000 nm. This process is performed 100 times and generates the curves shown in FIG. 8A. As shown in FIG. 8A, the transmittance for the coating in Table 2 is less than 40% over a wavelength range of 400 nm to 1000 nm for a 10% random thickness variability.

Figure 8B:
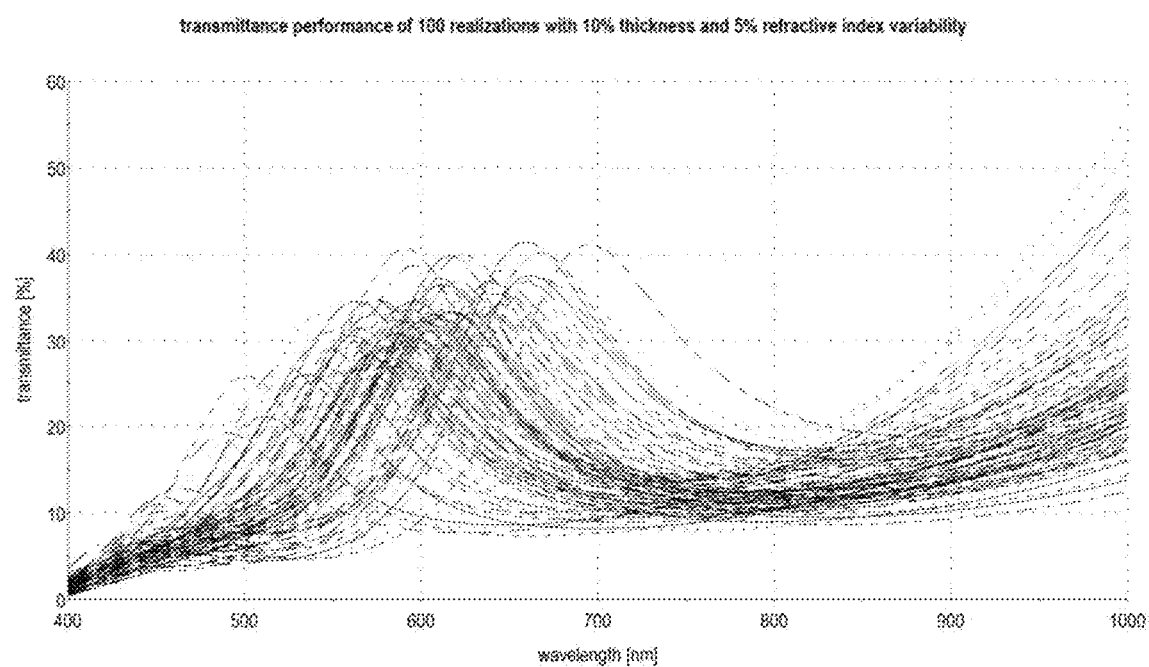
FIG. 8B depicts a transmittance versus wavelength graph of the exemplary coating in Table 2 having a 10% thickness variability and a 5% refractive index variability for each layer.

FIG. 8B depicts a transmittance versus wavelength graph in which the thickness of each layer of the coating in Table 2 is randomly adjusted (e.g. increased or decreased) by a random number corresponding to a Gaussian distribution whose mean value is the layer design thickness and whose variance is 10% of the layer design thickness and where the refractive index of each layer is randomly adjusted (e.g. increased or decreased) by a random number corresponding to a Gaussian distribution whose mean value is the layer refractive index and whose variance is 5% of the layer refractive index. The transmittance of the randomly adjusted coating is calculated over a wavelength range of 400 nm to 1000 nm. This process is performed 100 times and generates the curves shown in FIG. 8B. As shown in FIG. 8B, the transmittance for the coating in Table 2 is less than 60% over a wavelength range of 400 nm to 1000 nm for a 10% random thickness variability and a 5% random refractive index variability.

The glass wafer 100 has an average transmittance (T) value of less than 50%, preferably less than 40%, more preferably less than 30%, over an entire wavelength range of 400 nm to 1000 nm. As used herein, "average transmittance value" refers to the sum of the transmittance values at every wavelength in the defined wavelength range divided by the number of wavelengths over the defined wavelength range. In some embodiments, the glass wafer 100 has an average transmittance (T) value of less than 50%, preferably less than 40%, more preferably less than 30%, over an entire wavelength range of 400 nm to 2500 nm. In some embodiments, the transmittance value of the glass wafer 100 at every wavelength in the defined wavelength range (e.g. 400 nm to 1000 nm or 400 nm to 2500 nm) is less than 50%, preferably less than 40%, and more preferably less than 30%. As used herein, the term "transmittance" is defined as the percentage of incident optical power within a given wavelength range transmitted through the glass wafer 100. In general, transmittance is measured using a specific linewidth.

Figure 1B:
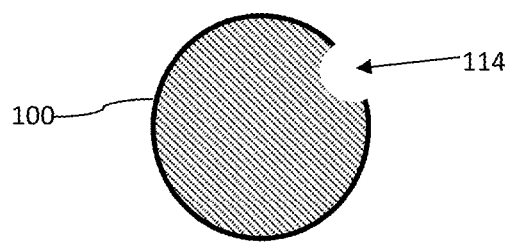
Figure 4:
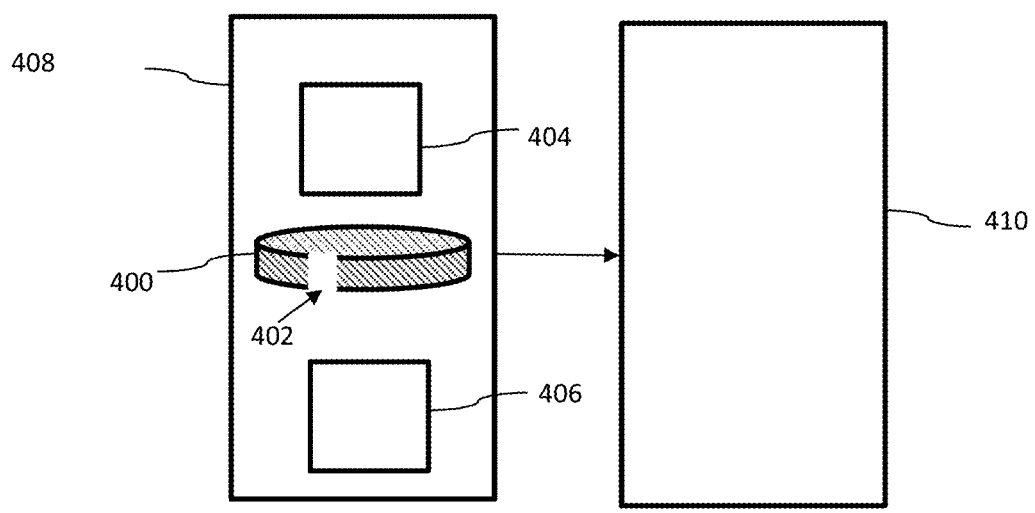
FIG. 4 depicts an exemplary glass wafer in accordance with some embodiments of the present disclosure positioned within an exemplary semiconductor fabrication system in accordance with some embodiments of the present disclosure.

FIG. 4 depicts an exemplary wafer in accordance with some embodiments of the present disclosure positioned within an exemplary semiconductor fabrication system in accordance with some embodiments of the present disclosure. In order for the glass wafer to be properly positioned or oriented during each step of the formation process, the glass wafer can have a notch along a portion of the edge that is used for orientation within the substrate aligner chamber 408. FIG. 1B depicts a glass wafer 100 having a notch 114 along its edge. Notches are specified in the SEMI™ semiconductor wafer standards.

In some embodiments, a method of fabricating an electronic device comprises loading a glass wafer 400, as described in the embodiments above, onto a substrate support (not shown) within a substrate aligner chamber 408. The substrate aligner chamber 408 comprises a light source 404 and an optical sensor 406 configured to detect a light beam from the light source 404. The glass wafer 404 comprises a top surface, a bottom surface opposing the top side, an edge surface between the top surface and the bottom surface, a first coating as described in the embodiments above and a second coating as described in the embodiments above. In some embodiments, the glass wafer 404 may also comprise a passivation layer. The substrate support rotates the glass wafer 400 to a predetermined position in the substrate aligner chamber. The predetermined position is reached when the optical sensor detects the light beam from the light source. As the glass wafer 400 rotates within the substrate aligner chamber 408 shown in FIG. 4, the optical sensor 406 cannot read the light from the light source 404 due to the second coating 110 disposed on the glass wafer 400. When the notch 402 reaches the light beam, it is read by the optical sensor 406 and the glass wafer 400 is accordingly in the proper position for transfer to a fabrication tool 410 for further processing.

In some embodiments, the glass wafer may undergo semiconductor fabrication processing in which the glass wafer is heated during the process then allowed to cool to room temperature. Embodiments of the glass wafers described herein maintain an average transmittance, and a transmittance at every wavelength in the wavelength range, of less than 50%, preferably less than 30%, following a heat treatment of 350 degrees Celsius for 2 hours and cooling to room temperature (e.g. 25 degrees Celsius) at a cooling rate of 10 degrees Celsius per minute.

Figure 5A:
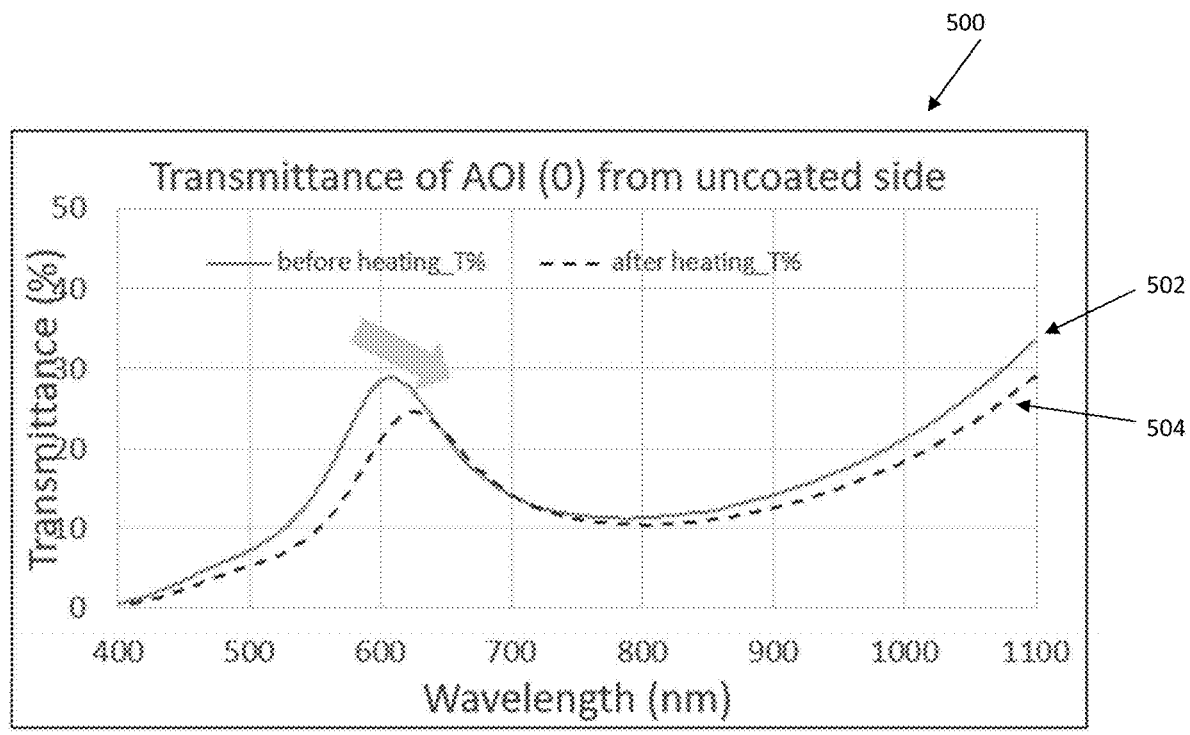
FIGS. 5A and 5B shows transmittance vs. wavelength graphs for an exemplary glass wafer in accordance with some embodiments of the present disclosure.
Figure 5B:
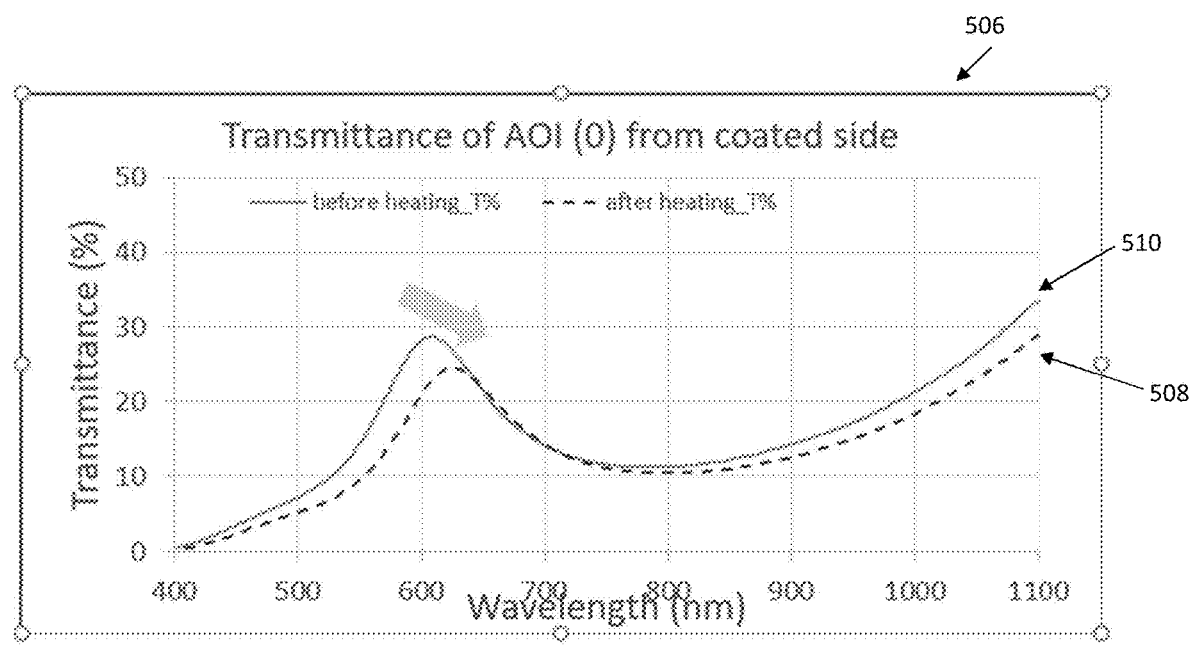

FIGS. 5A and 5B shows a transmittance vs. wavelength graph for an exemplary glass wafer having a doped nano-crystalline silicon coating disposed directly on the top surface 102 of the glass wafer 100, a layer of silicon nitride, a layer of undoped amorphous silicon, and a layer of silicon dioxide. The layer of silicon nitride is disposed atop the layer of undoped amorphous silicon. The layer of undoped amorphous silicon is disposed atop the layer of silicon dioxide. The layer of silicon dioxide is atop the doped nano-crystalline silicon coating.

Graph 500 depicted in FIG. 5A shows a transmittance curve 504 for the exemplary glass wafer after undergoing a heat treatment of 350 degrees Celsius for 2 hours and cooling to room temperature (e.g. 25 degrees Celsius) at a cooling rate of 10 degrees Celsius per minute (the "heat treatment") and a transmittance curve 502 for the glass wafer before it undergoes the heat treatment. For graph 500, transmittance data is collected from two points along the edge of the glass wafer at the uncoated side. Graph 506 depicted in FIG. 5B shows a transmittance curve 508 for the exemplary glass wafer after undergoing a heat treatment of 350 degrees Celsius for 2 hours and cooling to room temperature (e.g. 25 degrees Celsius) at a cooling rate of 10 degrees Celsius per minute and a transmittance curve 510 for the glass wafer before it undergoes the heat treatment. For graph 506, transmittance data is collected from two points along the edge of the glass wafer at the coated side. Based on graphs 5A and 5B, the exemplary glass wafer maintains an average transmittance, and a transmittance at every wavelength in the wavelength range, of less than 50% from a wavelength of 400 nm to 1100 nm even after the heating process described above.

Figure 6A:
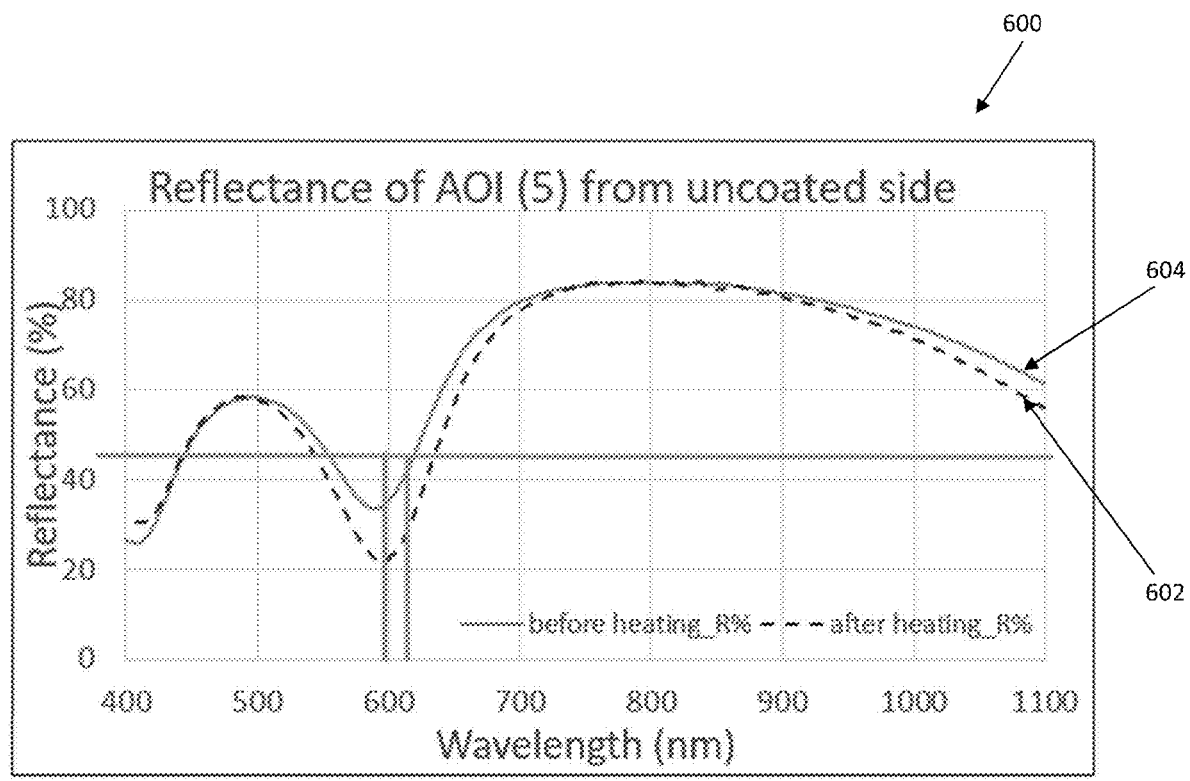
FIG. 6A-6D shows reflectance vs. wavelength graphs for an exemplary glass wafer in accordance with some embodiments of the present disclosure.

FIG. 6A-6D shows reflectance vs. wavelength graphs for an exemplary glass carrier wafer described above with respect to FIGS. 5A-5B. FIG. 6A is a reflectance vs. wavelength graph 600 showing a reflectance curve 602 for the glass wafer after undergoing a heat treatment of 350 degrees Celsius for 2 hours and cooling to room temperature (e.g. 25 degrees Celsius) at a cooling rate of 10 degrees Celsius per minute and a reflectance curve 604 for the glass wafer before it undergoes the heat treatment, where reflectance is measured from the uncoated side of the glass wafer at an angle of incidence of 5 degrees.

Figure 6B:
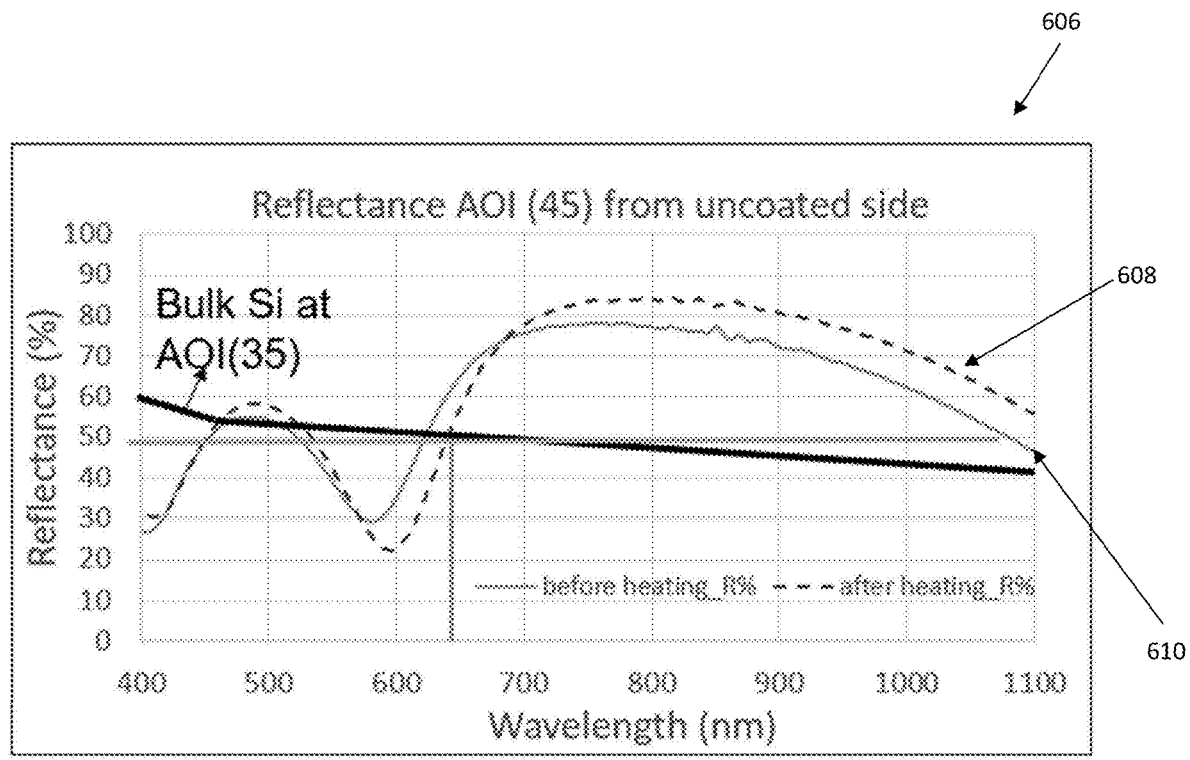

FIG. 6B is a reflectance vs. wavelength graph 606 showing a reflectance curve 608 for the glass wafer after undergoing a heat treatment of 350 degrees Celsius for 2 hours and cooling to room temperature (e.g. 25 degrees Celsius) at a cooling rate of 10 degrees Celsius per minute and a reflectance curve 610 for the glass wafer before it undergoes the heat treatment, where reflectance is measured from the uncoated side of the glass wafer at an angle of incidence of 45 degrees.

Figure 6C:
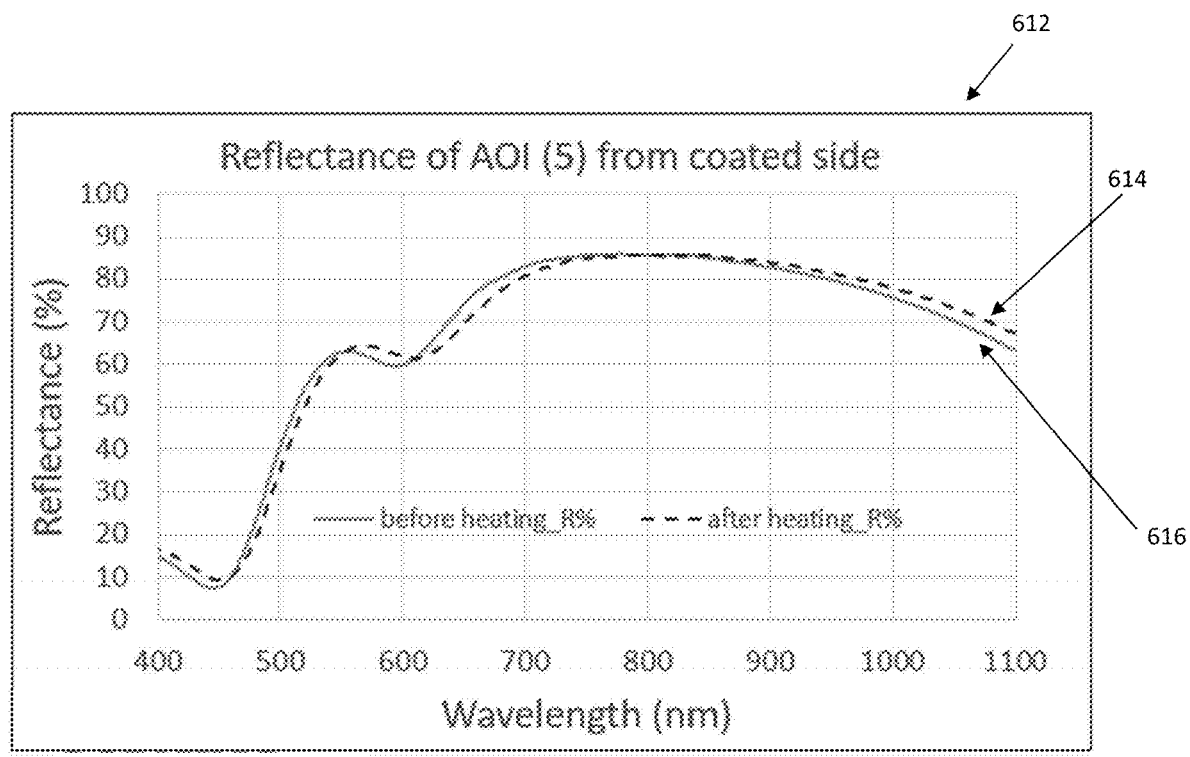

FIG. 6C is a reflectance vs. wavelength graph 612 showing a reflectance curve 614 for the glass wafer after undergoing a heat treatment of 350 degrees Celsius for 2 hours and cooling to room temperature (e.g. 25 degrees Celsius) at a cooling rate of 10 degrees Celsius per minute and a reflectance curve 616 for the glass wafer before it undergoes the heat treatment, where reflectance is measured from the coated side of the glass wafer at an angle of incidence of 5 degrees. As seen in FIG. 6C, the reflectance values of the glass wafer after it undergoes the heat treatment, over a wavelength range of 400 nm to 1100 nm is substantially similar to the reflectance values prior to the heat treatment.

Figure 6D:
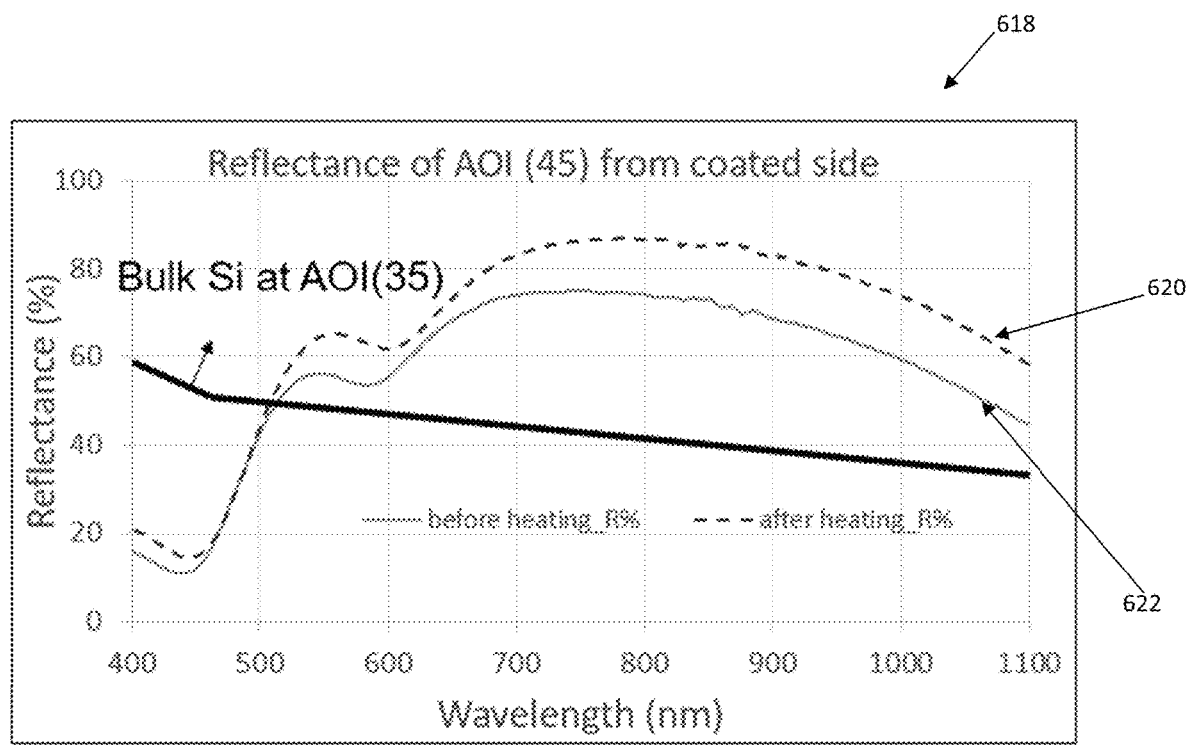

FIG. 6D is a reflectance vs. wavelength graph 618 showing a reflectance curve 620 for the glass wafer after undergoing a heat treatment of 350 degrees Celsius for 2 hours and cooling to room temperature (e.g. 25 degrees Celsius) at a cooling rate of 10 degrees Celsius per minute and a reflectance curve 622 for the glass wafer before it undergoes the heat treatment, where reflectance is measured from the coated side of the glass wafer at an angle of incidence of 45 degrees.

In some embodiments, wafers used in semiconductor processing equipment have a minimum reflectance value to enable the equipment to sense the presence of the wafer. FIG. 6D shows reflectance values for silicon, a commonly used wafer material, over a wavelength range of 400 nm to 1100 nm. As shown in FIG. 6D, the glass wafer with the exemplary coating described has an average reflectance value that meets or exceed that of silicon over a wavelength range of about 510 nm to 1100 nm. In some embodiments, the reflectance value at every wavelength over a wavelength range of about 510 nm to 1100 nm meets or exceed that of silicon. As used herein, "average reflectance value" refers to the sum of the reflectance values at every wavelength in the defined wavelength range (e.g. 510 nm to 1100 nm) divided by the number of wavelengths over the defined wavelength range.

While the foregoing is directed to embodiments of the present disclosure, other and further embodiments of the disclosure may be devised without departing from the basic scope thereof.

We claim:

1. A glass wafer for a semiconductor device, comprising:
   a glass substrate comprising: a top surface, a bottom surface opposing the top surface, and an edge surface between the top surface and the bottom surface;
   a first coating disposed atop the glass substrate, wherein the first coating is a doped crystalline silicon coating having a sheet-resistance of 100 to 1,000,000 ohm per square; and
   a second coating having one or more layers disposed atop the glass substrate, wherein the second coating comprises a layer of silicon nitride, a layer of undoped amorphous silicon, and a layer of silicon dioxide, wherein the layer of silicon nitride is disposed atop the layer of undoped amorphous silicon, wherein the layer of undoped amorphous silicon is disposed atop the layer of silicon dioxide, and wherein the layer of silicon dioxide is disposed atop the doped crystalline silicon coating,
   wherein the glass wafer has an average transmittance (T) of less than 50% over an entire wavelength range of 400 nm to 1000 nm.

2. The glass wafer of claim 1, wherein a transmittance at every wavelength in the entire wavelength range is less than 50%.

3. The glass wafer of claim 1, wherein the glass wafer has a transmittance (T) of less than 30% over the entire wavelength range of 400 nm to 1000 nm.

4. The glass wafer of claim 1, wherein the first coating is disposed directly atop the top surface of the glass substrate and the second coating is disposed directly atop the first coating.

5. The glass wafer of claim 1, wherein the second coating comprises at least two layers and wherein the first coating is located between the at least two layers of the second coating.

6. The glass wafer of claim 1, wherein the doped crystalline silicon coating is one of a phosphorus-doped crystalline silicon, a boron-doped crystalline silicon, or an arsenic doped-crystalline silicon.

7. The glass wafer of claim 1, further comprising a passivation coating atop the top surface, bottom surface, and edge surface of the glass substrate, wherein the passivation coating is one of SiN, $SiO_2$, or SiON.

8. A glass wafer for a semiconductor device, comprising:
   a glass substrate comprising: a top surface, a bottom surface opposing the top surface, and an edge surface between the top surface and the bottom surface; and
   a first coating disposed atop the glass substrate, wherein the first coating is a crystalline silicon coating;
   a second coating having one or more layers disposed atop the glass wafer, wherein the second coating comprises a layer of silicon nitride, a layer of undoped amorphous silicon, and a layer of silicon dioxide, wherein the layer of silicon nitride is disposed atop the layer of undoped amorphous silicon, wherein the layer of undoped amorphous silicon is disposed atop the layer of silicon dioxide, and wherein the glass wafer has an average transmittance (T) of less than 50% over an entire wavelength range of 400 nm to 1000 nm.

9. The glass wafer of claim 8, wherein the second coating covers an entire top surface of the glass substrate.

10. The glass wafer of claim 8, wherein the second coating covers a portion of the top surface of the glass substrate from the edge surface to a radial distance 2 mm toward a center of the top surface.

11. The glass wafer of claim 8, wherein a transmittance at every wavelength in the entire wavelength range is less than 50%.

12. The glass wafer of claim 8, wherein the glass wafer has an average transmittance (T) of less than 30% over the entire wavelength range of 400 nm to 1000 nm.

13. The glass wafer of claim 8, further comprising a passivation coating atop the top surface, bottom surface, and edge surface of the glass substrate.

14. The glass wafer of claim 13, wherein the passivation coating is one of SiN, $SiO_2$, or SiON.

15. A glass wafer for a semiconductor device, comprising:
a glass substrate comprising: a top surface, a bottom surface opposing the top surface, and an edge surface between the top surface and the bottom surface; and
a silicon containing coating disposed on the glass substrate, wherein the silicon containing coating comprises a layer of silicon nitride, a layer of undoped amorphous silicon, a layer of silicon dioxide, and a phosphorus-doped crystalline silicon layer, wherein the layer of silicon nitride is disposed atop the layer of undoped amorphous silicon,
wherein the layer of undoped amorphous silicon is disposed atop the layer of silicon dioxide,
wherein the layer of silicon dioxide is disposed atop the phosphorus-doped crystalline silicon layer, and
wherein a difference in refractive index values between the layer of silicon nitride and the layer of undoped amorphous silicon is greater than 0.5, and a difference in refractive index values between the layer of undoped amorphous silicon and the layer of silicon dioxide is greater than 0.5.

* * * * *